(12) United States Patent
Kadotani et al.

(10) Patent No.: US 6,235,146 B1
(45) Date of Patent: May 22, 2001

(54) VACUUM TREATMENT SYSTEM AND ITS STAGE

(75) Inventors: Masanori Kadotani, Kudamatsu; Saburo Kanai, Hikari; Youichi Itou, Kudamatsu; Takashi Fujii, Kudamatsu; Hironobu Kawahara, Kudamatsu; Ryouji Hamasaki, Hikari; Kazue Takahashi, Kudamatsu; Motohiko Yoshigai, Hikari, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/313,253

(22) Filed: May 18, 1999

(30) Foreign Application Priority Data

May 25, 1998 (JP) ................................. 10-143347

(51) Int. Cl.$^7$ ..................................... H01L 21/00
(52) U.S. Cl. ..................... 156/345; 118/723 E; 118/725; 118/728
(58) Field of Search ...................... 156/345; 118/723 R, 118/723 E, 728, 724, 725; 279/128; 361/234

(56) References Cited

U.S. PATENT DOCUMENTS

| 5,567,267 | * | 10/1996 | Kazama et al. | 156/345 |
| 5,587,205 | * | 12/1996 | Saito et al. | 156/345 |
| 5,981,913 | * | 11/1999 | Kadomura et al. | 279/128 |

* cited by examiner

Primary Examiner—Thi Dang
(74) Attorney, Agent, or Firm—Antonelli, Terry, Stout & Kraus, LLP

(57) ABSTRACT

A stage with an electrostatic attracting means is adapted for use in a wafer treatment at a high temperature in a vacuum treatment system. In a vacuum treatment system having a stage provided in a treatment chamber, which electrostatically attracts an object to the stage in a low pressure atmosphere, and treats the object at high temperature by heating the stage, an electrode member of the stage is made of titanium or a titanium alloy and a dielectric film for electrostatic attraction is formed on the electrode member. In order to bond firmly titanium and alumina ceramics, it is desirable to sandwich a nickel alloy (Ni—Al) between the materials.

14 Claims, 4 Drawing Sheets

VACUUM TREATMENT SYSTEM AND ITS STAGE

BACKGROUND OF THE INVENTION

The present invention relates to a vacuum treatment system for treating an object, such as a wafer, using a plasma or the like, in a low pressure atmosphere, and to its stage. More particularly, the invention relates to a vacuum treatment system, which is suited to perform etching of a wafer or the like at a high temperature, and to its stage.

Regarding a system for treating an object, such as a wafer, using a plasma or the like, in a low pressure atmosphere, a conventional technique of electrostatically attracting a wafer to a stage using an electrostatic attracting means and treating the wafer with a plasma has been proposed in Japanese Patent Application Publication Nos. 56-53853 and 57-44747. Unexamined Japanese Patent Application Publication Nos. 58-32410 and 60-115226 disclose a wafer treating method including the steps; of electrostatically attracting a wafer to a stage using an electrostatic attracting means, introducing an He gas to the back face of the wafer, and cooling or heating the wafer by thermal conduction, free convection, and forced convection.

In an ordinary etching process, the temperature at the wafer placing face of the stage is controlled to about 80° C. or lower. In some etching processes, however, controlling the wafer temperature to about 100 to 200° C. is needed. More specifically, in the etching of a multilayered film made of a metal and polysilicon, when a metal film is etched, the sample is treated at a high temperature of 100° C. or higher. Therefore, the etch rate of the metal film becomes high, so that excellent etching without causing a partial etch residue in the metal film and a barrier film can be realized. The barrier film is a film inserted between the metal and polysilicon in order to suppress inter diffusion. As a metal, tungsten can be used. As a material of the barrier film, tungsten nitride can be used.

A conventional ordinary stage for an etching process having an electrostatic attracting means is formed by thermal spraying of Ni and Al onto a base aluminium alloy and, then, by thermal spraying of alumina ceramics to form a dielectric film for electrostatic attraction. A stage support also serving as a linear guide shaft and a linear guide bearing are so provided under the stage as to vertically move the stage when a wafer is loaded/unloaded onto/from the placement face.

When it is assumed that a vacuum treatment system having a conventional stage is applied to a wafer treatment at a high temperature, there are the following problems.

First, in the conventional stage using aluminium as a base material, the coefficient of thermal expansion of aluminium as a base material is $24 \times 10^{-6}$ [°C.$^{-1}$]. If the temperature is increased from room temperature to 160° C., the thermal strain is $\epsilon = 24 \times 10^{-6}$ [°C.$^{-1}$] $\times (160-25)$ [°C.] $= 3.2 \times 10^{-3}$. At this time, a thermal strain is also introduced in the dielectric film for electrostatic attraction. The strain is obtained by $\epsilon 1 = 7 \times 10^{-6}$ [°C.$^{-1}$] $\times (160-25)$ [°C.] $= 0.95 \times 10^{-3}$ from the coefficient of thermal expansion of alumina ceramics of $7 \times 10^{-6}$ [°C.$^{-1}$]. Since the Young's modulus of alumina ceramics is $E = 2.6 \times 10^{4}$ [(kgf/mm$^2$], the thermal stress applied on the dielectric film at this temperature difference is obtained by $\sigma = (\epsilon - \epsilon 1) \times E = 59$ [kgf/mm$^2$]. The stress is larger than 29 [kgf/mm$^2$] of the strength of alumina ceramics. The alumina ceramics therefore become fractured and so electrostatic attraction cannot be employed.

Conventionally, the stage, the insulating plate, and the stage support are entirely in close contact with each other and have a structure such that heat escapes easily from the stage to the stage support. It is therefore difficult to maintain the wafer placement face of the stage at a high temperature. The tendency becomes more conspicuous as the amount of heat flow to the wafer increases and the diameter of the wafer becomes larger.

Further, conventionally, a linear guide bearing is positioned in the vacuum above a bellows. By using the stage support as a linear guide shaft, the stage is moved vertically without causing shaft runout. As the bearing, a solid bearing made of a fluororesin is employed. In the case of the conventional structure, when the stage is controlled at a high temperature, the temperature of the stage support serving as a guide increases due to the influence of the heat flow. In this case, there is a problem in that the clearance with the bearing becomes zero, the bearing functions as a brake, and the stage can not move vertically.

SUMMARY OF THE INVENTION

It is a first object of the invention to provide a stage with an electrostatic attracting means, which is adapted to wafer treatment at a high temperature, and a vacuum treatment system having the stage.

It is a second object of the invention to provide a stage, which can maintain the temperature of a wafer placement face at a predetermined high temperature, and a vacuum treatment system having the stage.

It is a third object of the invention to provide a stage, which can be moved smoothly in the vertical direction even when the temperature of the stage becomes high, and a vacuum treatment system having the stage.

In order to achieve the first object of the invention, there is provided a vacuum treatment system, having a stage provided in a treatment chamber, for electrostatically attracting an object to the stage in a low pressure atmosphere and treating the object at a high temperature by heating the stage, wherein an electrode member of the stage is made of titanium or a titanium alloy and a dielectric film for electrostatic attraction is formed on the electrode member.

Since the electrode member is made of titanium in accordance with the invention, even when the temperature of the stage becomes high, the thermal strain in the stage is small and the thermal stress can be suppressed so as to be smaller than the strength of the alumina ceramics.

Since the bonding between titanium and alumina ceramics is not firm, it is desirable to sandwich a nickel alloy (Ni—Al) between the materials.

In order to achieve the second object of the invention, there is provided a vacuum treatment system comprising: a stage provided in a treatment chamber and held by a stage support; a means for heating an electrode member of the stage; and an insulating plate provided between the electrode member of the stage and the stage support, for electrostatically attracting an object to the stage in a low pressure atmosphere and treating, the object at a high temperature by heating the stage wherein the electrode of the stage is made of titanium or a titanium alloy, a clearance for thermal insulation is provided between the electrode member and the insulating plate, and a clearance for thermal insulation is provided between the insulting plate and the stage support.

In accordance with the invention, a structure in which clearances are provided respectively between the stage and the insulating plate and between the insulating plate and the stage support is adopted. When a sample is treated, the pressure around the stage is about 1 Pa and the structure is effective as a vacuum insulation. That is, a stage which can efficiently transfer heat by reducing the heat flow escaping from the stage to the stage support is provided.

In order to achieve the third object of the invention, there is provided a vacuum treatment system comprising: a stage provided in a treatment chamber and which is held movable in the vertical direction by a stage support via a bearing; a means for heating an electrode member of the stage; and an insulating plate disposed between the electrode member and the stage support, for electrostatically attracting an object to the stage in a low pressure atmosphere, and treating the object at a high temperature by heating the stage; wherein the electrode member of the stage is made of titanium or a titanium alloy, and the stage support and the bearing are disposed in an atmosphere outside of the treatment chamber.

As a titanium alloy, a titanium alloy of either type, near type, +β type, or β type is adopted.

According to the invention, as a stage lifting mechanism, the bearing and shaft which prevent shaft runout are positioned away from a high temperature part and are disposed in the atmosphere. Therefore, even when the temperature of the stage becomes high, the bearing part of the stage lifting mechanism is not influenced by the temperature of the stage. Thus, even if the temperature of the stage becomes high, the stage can be vertically moved without causing shaft runout.

DETAILED DESCRIPTION OF THE PREFERRED EMBODIMENTS

Figure 1:
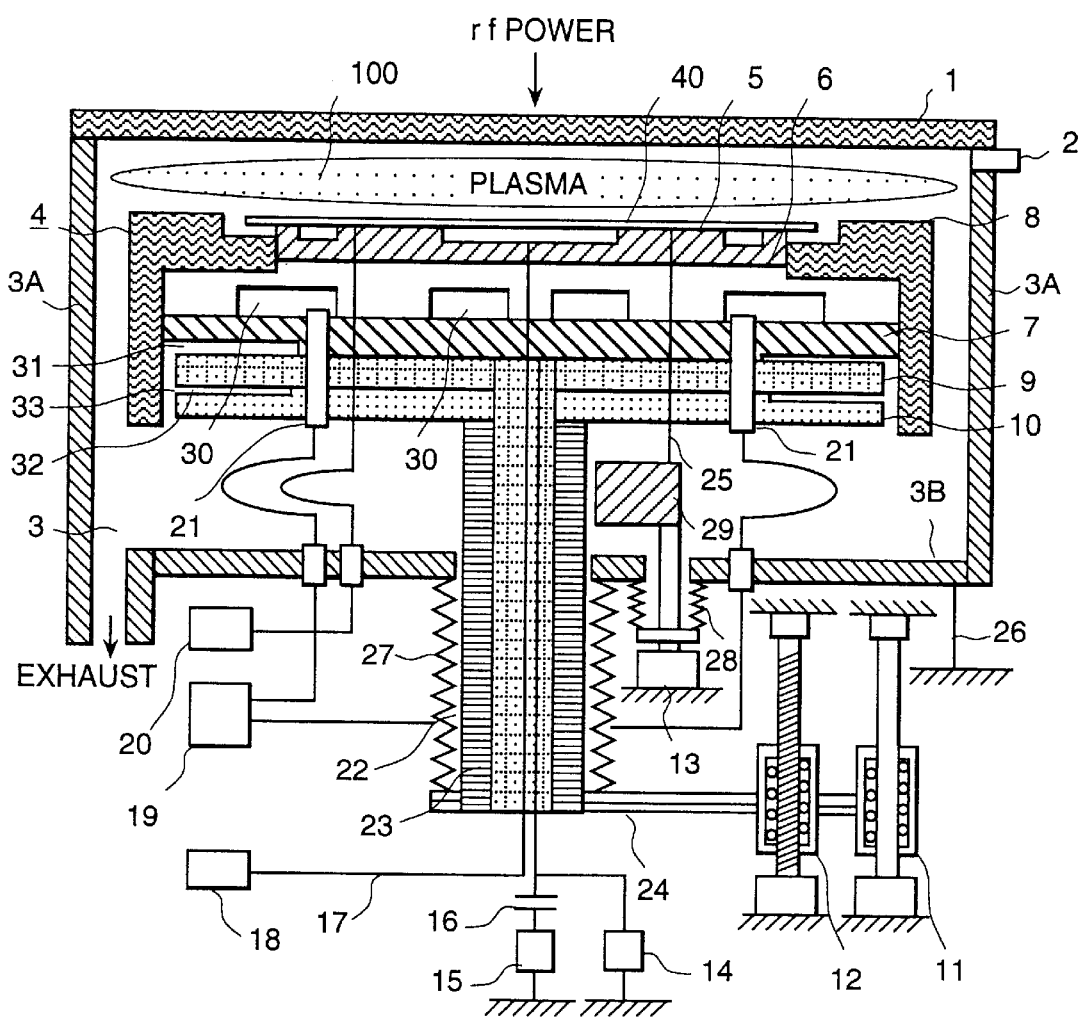
FIG. 1 is a vertical cross section of a vacuum treatment system representing an embodiment of the invention.

The construction of a magneto-microwave plasma etching system to which a first embodiment of the invention is applied will be described hereinbelow with reference to the drawings. A treatment chamber 3 which is formed by side walls 3A, a bottom 3B, and a dielectric material window 1 (for example, made of quartz or alumina ceramics) at the upper end, and has therein a stage 4 on which an object to be treated, for example, a wafer is placed. Microwaves are introduced through the dielectric material window 1 into the treatment chamber 3 and an etching gas is supplied from an etching gas introducing nozzle 2. The stage 4 is formed by an electrode member 7 made of titanium on which a Ni—Al alloy layer 6 is coated by thermal spraying and a dielectric such as alumina ceramics ($Al_2O_3$) serving as a dielectric film 5 is provide for electrostatic attraction on the Ni—Al alloy layer 6. The rim part is disposed under a stage cover 8 made of alumina or quartz. An insulating plate 9 is disposed between the electrode member 7 and a stage support 10. The treatment chamber 3 can be evacuated by a vacuum pump (not shown). As a material of the insulating plate 9, alumina, zirconia, fluororesin, quartz, silicon nitride, aluminium nitride, or the like is used.

A stage shaft 22 is coupled to the stage support 10. The lower part of the stage shaft 22 is projected from the treatment chamber 3 through a hole in the bottom 3B. An insulating shaft 23 integrally formed with the insulating plate 9 is provided within the stage shaft 22. The material of the insulating shaft 23 is the same as that of the insulating plate 9.

The insulating plate 9 and the insulating shaft 23 are made of a material having excellent electrical and thermal insulating characteristics so as to electrically and thermally insulate the electrode member 7 from the stage support 10, the stage shaft 22, and the bottom 3B. To make the electric and thermal insulation more secure between the electrode member 7 and the insulating plate 9, between the insulating plate 9 and the stage support 10, and between the insulating plate 9 and the stage cover 8, clearances 31, 32, and 33 are created, respectively. The clearances communicate with the treatment chamber 3 and enter a highly evacuated state at the time of treatment.

A bellows 27 is provided between the bottom 3B and the outer periphery of the stage shaft 22. On the outside of the bellows 27, that is, in the atmosphere, as a stage lifting mechanism, a base 24 made of a stainless steel connected to the stage shaft 22, a stage vertical guide part 11, and a stage vertical driving part 12 are provided. The stage vertical guide part 11 and the stage vertical driving part 12 take the forms of a shaft and a ball bearing, respectively. The shaft and the ball bearing are set at positions away from the electrode member 7 whose temperature increases.

The temperature of the stage 4 is regulated by controlling the amount of coolant circulating in the air gaps 30 in the electrode member 7 via coolant introducing nozzles 21 by a coolant temperature controller 19 on the basis of an output of a temperature sensor 20 which senses the temperature of the wafer placement face. In case of performing high temperature etching, the temperature of the wafer placement face is controlled to be, for example, 150° C.

The electrode member 7 of the stage 4 is connected to a DC power supply 14 via a conductor (and a low pass filter) in the insulating shaft 23. During the etching process, a plasma is generated by the above-mentioned method and a wafer 40 is supported by an electrostatic attraction generated by applying a DC voltage across the dielectric film. The bottom 3B is connected to the ground 26.

In the insulating shaft 23, a heat transfer gas supply path, extending through a hole 42 (refer to FIG. 2) in the central part of the electrode member 7 to the face on which the wafer 40 is placed, is formed. A heat transfer gas introducing pipe 17 is connected to the lower end of the heat transfer gas supplying path. A supply amount of a heat transfer gas, such as He, is controlled by a heat transfer gas pressure control system 18 so that the gas pressure between the wafer placement face and the wafer 40 becomes a predetermined value.

The construction of the stage 4 and the dielectric film 5 for electrostatic attraction will be described. In the electrode member 7 of the stage 4 and the dielectric film 5 for electrostatic attraction, holes are opened in the plate thickness direction to accommodate a plurality of wafer lift pins 25 for lifting the wafer 40 from the dielectric film 5 for electrostatic attraction in order to convey the wafer 40 at the wafer placement face. The temperature sensor 20 is constructed by utilizing a part of the wafer lift pins 25.

Figure 2:
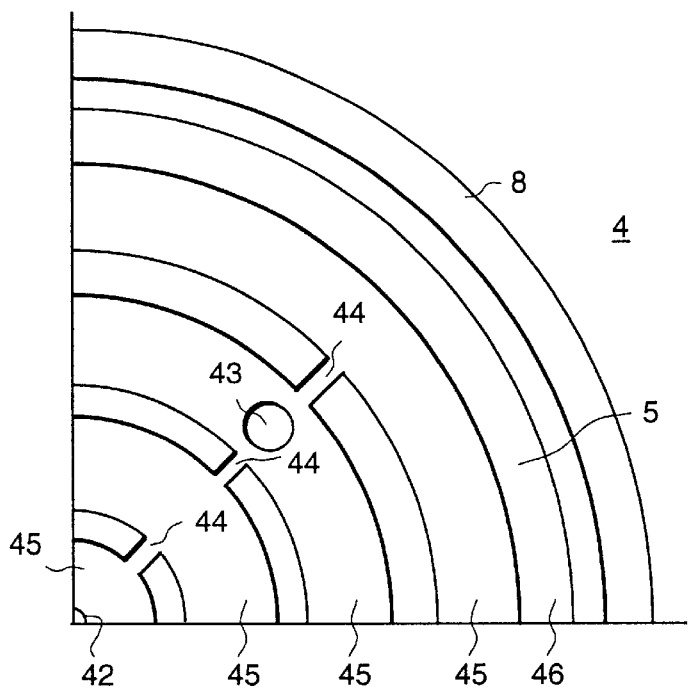
FIG. 2 is a plan view of a dielectric film for electrostatic attraction in the embodiment of FIG. 1.

As shown in FIG. 2, in the dielectric film 5 for electrostatic attraction on the wafer placement face of the stage 4, there are formed a plurality of trenches 44 extending radially from the hole 42 for supplying heat transfer gas and annular trenches 45 connecting the trenches 44. Each of the trenches has a depth of 0.05 to 0.1 mm and a width of 0.5 to 1 mm and is processed with ultrasonic waves. Reference number 43 denotes a hole through which the wafer lift pin 25 passes. In the outermost peripheral part of the dielectric film 5 for electrostatic attraction, an annular projection 46 having no trench 44 is formed.

One end of the wafer lift pin 25 is supported by a slide bearing 29 and is vertically moved by a wafer lift pin driving unit 13. A bellows 28 is provided between the bottom 3B and the outer periphery of the wafer lift pin driving unit 13.

Figure 3:
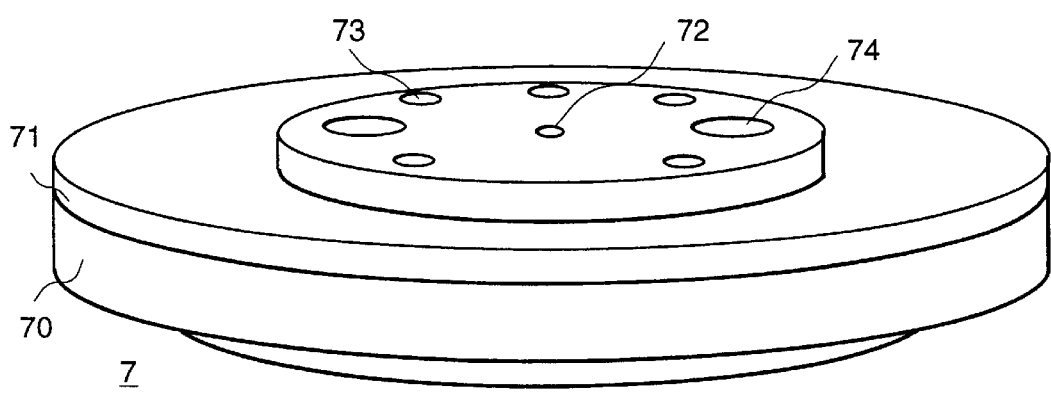
FIG. 3 is a perspective view of the rear face of a stage in the embodiment of FIG. 1.

As shown in FIG. 3, the electrode 7 is obtained by integrally diffusion bonding an upper member 70 and a lower member 71 which are made of titanium. A hole 72 for supplying heat transfer gas, holes 73 for the wafer lift pins, and holes 74 for the coolant introducing nozzles are opened in the electrode member 7. In the upper member 70, recessed parts (not shown) corresponding to the air gaps 30 are formed. In the lower member 71, in order to assure the clearance 31 for insulation, the outer peripheral part of the bottom is recessed. As an example, in a system for a wafer having the diameter of 200 mm, the height of the outer peripheral part of the electrode member 7 is set to 3 cm and the outer diameter of the electrode member 7 is set to 25 cm. In a system for a wafer having the diameter of 300 mm, the height of the outer peripheral part of the electrode member 7 is set to 3 cm and the outer diameter of the electrode member 7 is set to 35 cm.

Titanium alloys as mentioned below can be used. attraction, holes type, near type CP Ti (first kind, second kind, third kind), Ti-0.15Pd, Ti-5Al-2.5Sn, Ti-8Al-1V(8-1-1), Ti-6Al-2Sn-4Zr-2Mo-0.1Si(6-2-4-2s), Ti-6Al5Zr-0.5Mo-0.25Si(IMI685)

+β type Ti-6Al-4V(6-4), Ti-6Al-2Sn-4Zr-6Mo(6-2-4-6)

β type Ti-13V-11Cr-3Ar(13-3-1), Ti-11.5Mo-4.5Sn6Zr (Be6aIII), Ti-4Mo-8V-6Cr-3Al-4Zr(BetaC), Ti-15Mo5Zr-3Al(15-5-3)

Figure 4:
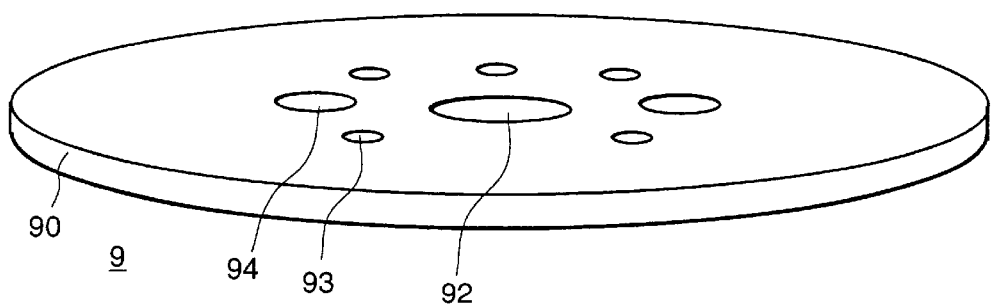
FIG. 4 is a perspective view of the rear face of an insulating plate in FIG. 1.

As shown in FIG. 4, the insulating plate 9 is formed by a disc-shaped plate member and has a hole 92 for supplying heat transfer gas, holes 93 for the wafer lift pins, and holes 94 for the coolant introducing nozzles. In order to ensure the clearance 33 for insulation from the stage cover 8, the outer diameter of the insulating plate 9 is set to be slightly smaller than that of the stage cover 8. The size of the clearance 33 is set to, for example, a value from 0.1 mm to 2 mm.

Figure 5:
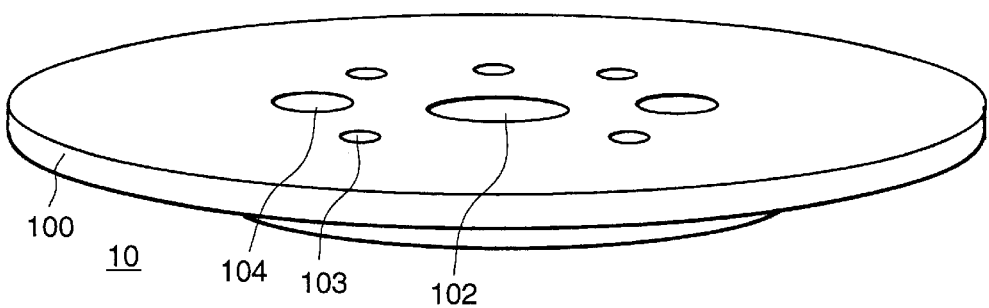
FIG. 5 is a perspective view of the rear face of a stage support in FIG. 1.

As shown in FIG. 5, the stage support 10 is formed by an almost disc-shaped plate member and has a hole 102 for supplying heat transfer gas, holes 103 for the wafer lift pins, and holes 104 for the coolant introducing nozzles. In order to ensure clearances 32 and 33 for insulation, the outer peripheral part of the bottom is recessed, and the outer diameter of the stage support 10 is set to be slightly smaller than that of the stage cover 8 in a manner similar to the insulating plate 9.

An etching process according to the embodiment of the invention will now be described. The treatment chamber 3 is evacuated while introducing an etching gas into the chamber 3 at a predetermined flow rate. The wafer 40 is etched in such a manner that a plasma (100) is generated from the etching gas in the treatment chamber 3 by the interaction between microwaves and a magnetic field generated by a solenoid (not shown), a radio frequency is applied from a radio frequency (rf) power supply 15 for bias application via a capacitor 16 to the stage 4, and the energy of ions impinging on the wafer 40 is controlled.

Figure 6:
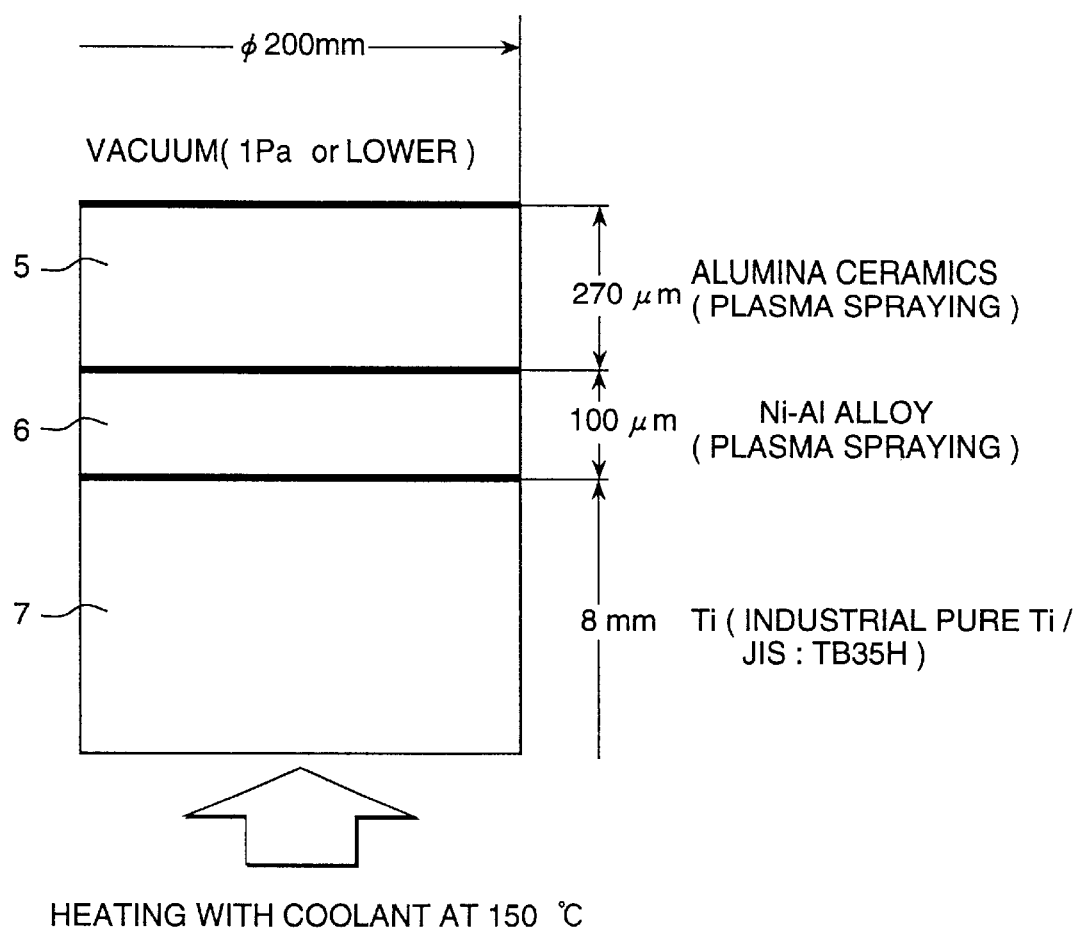
FIG. 6 is a diagram for explaining characteristics of the stage of the embodiment of FIG. 1.

Referring to FIG. 6, the material of the stage 4 according to the invention will be described. When the electrode member 7 is made of titanium, the coefficient of thermal expansion is as small as $8.5 \times 10^{-6}$ [°C.$^{-1}$] which is about ⅓ of that of aluminium. Consequently, the thermal strain is small and $'=8.5 \times 10^{-6}$ [°C.$^{-1}$]$\times(160-25)$[°C.]$=1.1 \times 10^{-3}$. The thermal stress generated is $\sigma'=('-1) \times E=4$[kgf/mm$^2$]. Thus, the thermal stress can be suppressed below the strength of alumina ceramics.

Since the bonding between titanium and alumina ceramics is not firm, about 100 µm of a nickel alloy (Ni—Al) is sandwiched between the materials in the embodiment of the invention. In this case, although the coefficient of thermal expansion of the nickel alloy (Ni—Al) is $19 \times 10^{-6}$ [°C.$^{-1}$] and is larger than that of titanium, the film thickness is on the order of 0.1 mm, which is ¹⁄₁₀₀ of few cm of a the size of the base material and is sufficiently small. The thermal strain is therefore determined by the electrode member 99 or higher percentage. Thus, it can be said that the strength of the dielectric film is hardly deteriorated by the thermal strain.

The invention can be also applied to etching systems other than a magneto-microwave plasma etching system; for example, the invention can be applied to a parallel plate reactive ion etching (RIE) system. One difference from the magneto-microwave plasma etching system is that an upper electrode, which faces the stage 4 and is connected to the ground, is provided and a plasma is generated by applying a radio frequency from the rf power supply for bias application across the electrodes, in place of generating a plasma by the interaction of the microwaves and the magnetic field generated by the solenoid. The system is different from the foregoing embodiment only with respect to the plasma generating method. A similar etching can be carried out by constructing the stage 4 in a manner similar to the foregoing embodiment.

The invention can be also applied to a sputtering system. In a sputtering system, a target for film formation is placed on the upper electrode, a wafer is displaced on a stage having a heater for heating the wafer, a plasma is generated by applying a radio frequency across the upper electrode and the stage from the rf power supply for bias application, a shutter is opened, and a film is formed on the wafer surface from the target. Some differences from the etching system are that the treatment pressure is lower and the wafer is treated while being heated. By constructing the stage in a manner similar to the foregoing embodiment, a sputtering process can be similarly performed.

As mentioned above, the invention can be widely applied to systems for treating a sample, such as a wafer, using a plasma or the like, in a low pressure atmosphere, while heating the sample. As examples of the various ways of treating an object using a plasma, plasma etching, plasma CVD, sputtering, and the like can be named. As examples of ways of treating an object without using a plasma, ion implantation, MBE, evaporation, low pressure CVD, and the like can be named.

According to the invention, a stage with the electrostatic attracting means adapted to a wafer treatment at a high temperature and the vacuum treatment system having such a stage can be provided.

A stage which can maintain the temperature of the wafer placement face at a predetermined high temperature and the vacuum treatment system having such a stage can be also provided.

Furthermore, a stage which can be moved smoothly in the vertical direction even when the temperature of the stage becomes high and the vacuum treatment system having such a stage can be provided.

What is claimed is:

1. A vacuum treatment apparatus for treating an object at high temperatures, comprising:
   a treatment chamber capable of being evacuated to low pressure atmosphere;
   a stage provided in said treatment chamber, wherein said stage includes an electrode member and a dielectric film for electrostatic attraction on said electrode member, for electrostatically attracting said object to said stage; and
   means for directly heating said electrode member of said stage,
   wherein said electrode member of said stage is made of titanium or a titanium alloy and said dielectric film is made of alumina ceramics.

2. A vacuum treatment apparatus according to claim 1, wherein the stage is formed by thermal spraying Ni—Al alloy to form a Ni—Al layer on the electrode member made of titanium or a titanium alloy and thermal spraying alumina ceramics to form the dielectric film for electrostatic attraction on the Ni—Al alloy layer.

3. A vacuum treatment apparatus according to claim 1, wherein said means for directly heating said electrode member of said stage is a means to heat said electrode member at 100° C. to 200° C.

4. A vacuum treatment apparatus according to claim 1, wherein a nickel-aluminum alloy layer is provided between said titanium or titanium alloy and said dielectric film.

5. A vacuum treatment apparatus according to claim 1, wherein said means for directly heating said electrode member includes material supply structure for passing a material to the electrode member.

6. A vacuum treatment apparatus according to claim 5, wherein passages are provided adjacent said electrode member for passage of the material supplied by the material supply structure.

7. A vacuum treatment apparatus according to claim 6, wherein said passages are provided by gaps in the electrode member.

8. A vacuum treatment apparatus for treating an object at high temperatures, comprising:
   a treatment chamber capable of being evacuated to low pressure atmosphere;
   a stage provided in said treatment chamber and held by a stage support, wherein said stage includes an electrode member and a dielectric film for electrostatic attraction on said electrode member, for electrostatically attracting said object to said stage;
   means for heating said electrode member of said stage, for treating said object at a high temperature by heating said stage; and
   an insulating plate disposed between said electrode member of said stage and said stage support,
   wherein said electrode member of said stage is made of titanium or a titanium alloy, a clearance for thermal insulation is provided between said electrode member and said insulating plate, and a clearance for thermal insulation is provided between said insulating plate and said stage support.

9. A vacuum treatment apparatus according to claim 8, wherein said means for heating said electrode member of said stage is a means to heat said electrode member at 100° C. to 200° C.

10. A vacuum treatment apparatus according to claim 8, wherein said insulating plate is made of material selected from the group consisting of alumina, zirconia, fluororesin, quartz, silicon nitride and aluminum nitride.

11. A vacuum treatment apparatus for treating an object at high temperatures, comprising:
    a treatment chamber capable of being evacuated to low pressure atmosphere;
    a stage provided in said treatment chamber and held by a stage support, wherein said stage includes an electrode member and a dielectric film for electrostatic attraction on said electrode member, for electrostatically attracting said object to said stage;
    means for heating said electrode member of said stage, for treating said object at a high temperature by heating said stage; and
    an insulating plate disposed between said electrode member of said stage and said stage support,
    wherein a clearance for thermal insulation is provided between said electrode member of said stage and said insulating plate and a clearance for thermal insulation is provided between said insulating plate and said stage support, and the clearances communicate with said treatment chamber.

12. A vacuum treatment apparatus according to claim 11, wherein said means for heating said electrode member of said treatment stage is a means to heat said electrode member at 100° C. to 200° C.

13. A vacuum treatment apparatus according to claim 11, wherein said insulating plate is made of material selected from the group consisting of alumina, zirconia, fluororesin, quartz, silicon nitride and aluminum nitride.

14. A vacuum treatment apparatus for treating an object at high temperatures, comprising:
    a treatment chamber capable of being evacuated to low pressure atmosphere;
    a stage provided in said treatment chamber, wherein said stage includes an electrode member and a dielectric film for electrostatic attraction on said electrode member, for electrostatically attracting said object to said stage; and
    means for heating said electrode member of said stage,
    wherein the electrode member of the stage is made of titanium or a titanium alloy, and wherein the stage is formed by thermal spraying Ni—Al alloy to form a Ni—Al alloy layer on the electrode member made of titanium or a titanium alloy and thermal spraying alumina ceramics to form the dielectric film for electrostatic attraction on the Ni—Al alloy layer.

* * * * *